(12) United States Patent  
Haraguchi et al.

(10) Patent No.: US 7,983,112 B2  
(45) Date of Patent: Jul. 19, 2011

(54) SEMICONDUCTOR DEVICE WHICH TRANSMITS OR RECEIVES A SIGNAL TO OR FROM AN EXTERNAL MEMORY BY A DDR SYSTEM

(75) Inventors: Masaru Haraguchi, Tokyo (JP); Tokuya Osawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 842 days.

(21) Appl. No.: 12/010,674

(22) Filed: Jan. 29, 2008

(65) Prior Publication Data

US 2008/0181047 A1     Jul. 31, 2008

(30) Foreign Application Priority Data

Jan. 30, 2007   (JP) ................... 2007-019295

(51) Int. Cl.
    *G11C 8/16*   (2006.01)
(52) U.S. Cl. ............ 365/233.13; 365/193; 365/194; 365/201
(58) Field of Classification Search ........... 365/233.13, 365/193, 194, 201
    See application file for complete search history.

(56) References Cited

U.S. PATENT DOCUMENTS

| | | | |
|---|---|---|---|
| 6,615,345 B1 * | 9/2003 | LaBerge | 713/100 |
| 7,002,378 B2 * | 2/2006 | Srikanth et al. | 327/50 |
| 7,117,382 B2 * | 10/2006 | Khieu et al. | 713/401 |
| 7,170,818 B2 * | 1/2007 | Kyung | 365/189.15 |
| 7,567,104 B2 * | 7/2009 | Ku et al. | 327/161 |
| 7,652,932 B2 * | 1/2010 | Millar et al. | 365/189.07 |

FOREIGN PATENT DOCUMENTS

JP          11-072540          3/1999

OTHER PUBLICATIONS

Provost et al., "AC IO Loopback Design for high Speed uProcessor IO Test", ITC International Test Conference, 2004, IEEE, pp. 23-30.

* cited by examiner

*Primary Examiner* — Alexander Sofocleous
(74) *Attorney, Agent, or Firm* — McDermott Will & Emery LLP

(57) ABSTRACT

A semiconductor device in the present invention includes a DLL circuit which determines a phase shift amount, an arithmetic circuit which shifts the phase shift amount by a predetermined phase at test mode time, registers which set the phase shift amount, and a transmission circuit which shifts a phase to the set phase to transmit or receive a signal. The transmission circuit has a first phase shifter which shifts a first signal to the set phase, a first bidirectional buffer which loops back the first signal at the test mode time, a second phase shifter which phase-shifts the signal outputted from the first bidirectional buffer, a third phase shifter which phase-shifts a third signal, a second bidirectional buffer which loops back the third signal at the test mode time, a fourth phase shifter which phase-shifts the signal outputted from the second bidirectional buffer, and a FIFO which takes out an output signal of the second phase shifter or the fourth phase shifter.

6 Claims, 8 Drawing Sheets

F I G . 8
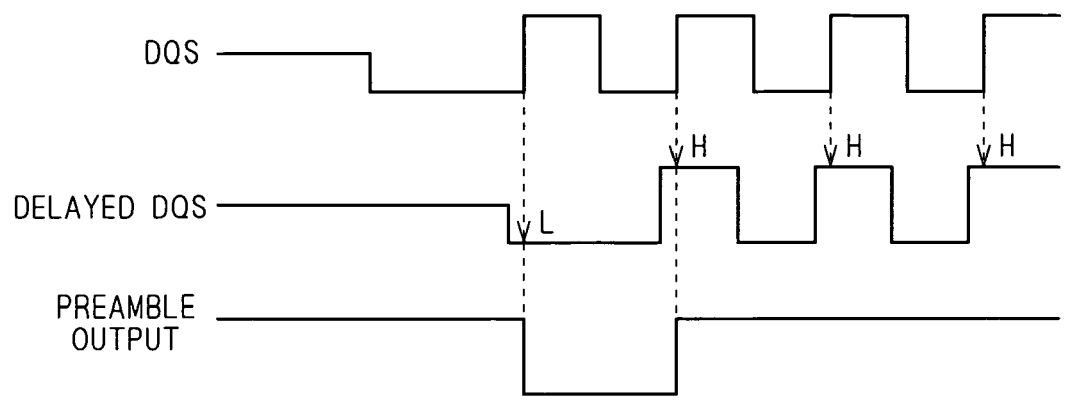
F I G . 9
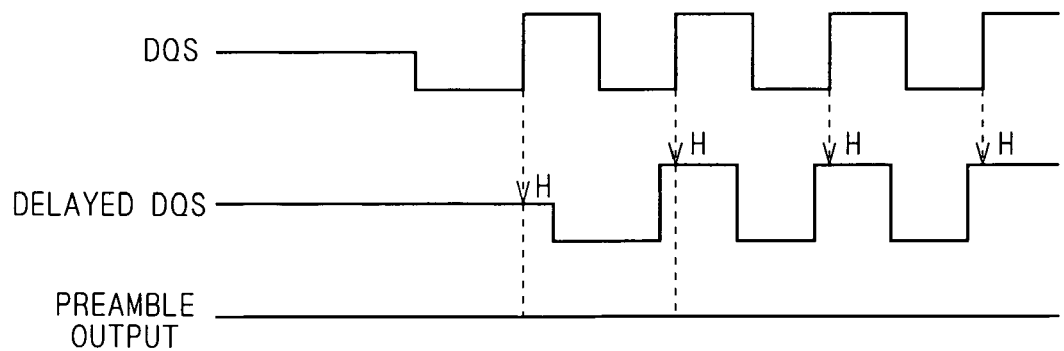

F I G. 1 0
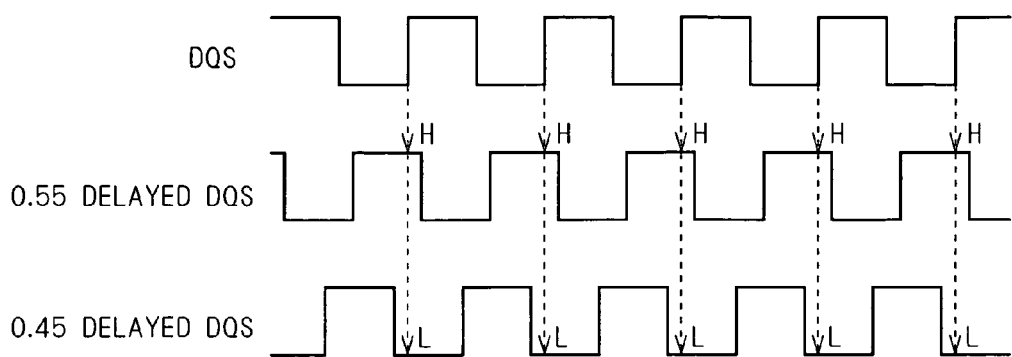
F I G. 1 1
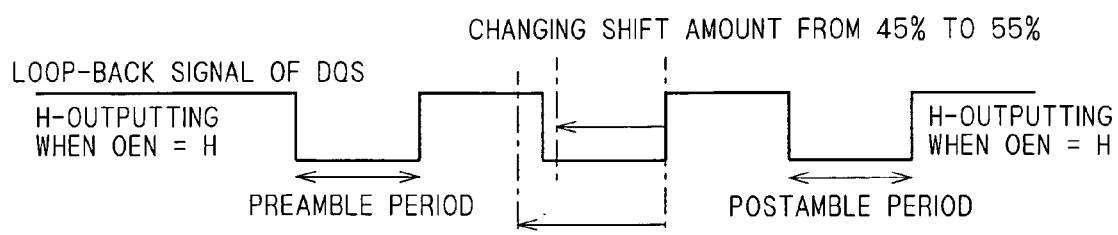

SEMICONDUCTOR DEVICE WHICH TRANSMITS OR RECEIVES A SIGNAL TO OR FROM AN EXTERNAL MEMORY BY A DDR SYSTEM

CLAIM OF PRIORITY

This application claims the benefit of Japanese Patent Application No. JP 2007-019295, filed on Jan. 30, 2007 the disclosure of which is incorporated herein by reference.

BACKGROUND OF THE INVENTION

1. Field of the Invention

The present invention relates to a semiconductor device housing a test circuit that determines whether or not an interface circuit, which transmits or receives data to or from an external memory, normally operates, and especially relates to a semiconductor device including a DDRif (double data rate interface circuit) that transfers data in synchronism with the rise or fall of a clock signal so as to transmit or receive data at high speed.

2. Description of the Background Art

A DDRif in the prior art has been configured by: a DLL (delay locked loop circuit) that determines a phase shift amount; a phase shifter that shifts a DQ (data signal) at 90 degrees at write time; a phase shifter that shifts a DQS (data strobe signal) at 90 degrees at read time; a circuit that detects a preamble period at read time; a FIFO that resyncronizes data at read time to a clock; and a buffer capable of inputting or outputting data, and outputting a clock/command (see ITC 2004 Digest of Technical Paper, "AC IO Loopback Design for High Speed uProcessor IO Test", B Provost, et al.).

Whether or not the DDRif with the above-mentioned configuration normally operates has been determined by measurement of a variety of AC timings using an external tester. For example, a characteristic fluctuation has been determined using a highly accurate tester at the time of evaluation, and a characteristic evaluation has been performed using an alternative simple tester in a test before shipment.

Further, Japanese Patent Application Laid-Open No. Hei 11-72540 shows a semiconductor device including a circuit in which an input clock is shifted in accordance with instruction data from the outside and then taken in, and a delay amount is measured from a result of comparison with the taken-in data, to measure input setup/hold time.

However, a DDR-SDRAM with an enhanced speed has been required to operate with a higher degree of accuracy, and in order to ensure a variety of AC timings defined with respect to the DDR-SDRAM by using an external tester, a highly accurate tester capable of performing a very high-speed operation is needed, thereby causing a problem of increased test cost. Further, in the case of determining accuracy of an internal operation by using an external tester, there has been a problem in that under the influence of a channel along which data is pulled out to the external tester, a highly accurate test cannot be performed.

Further, in the configuration shown in Japanese Patent Laid-Open No. Hei 11-72540, it is necessary in generating a desired phase difference to read a DLL code in a locked state to the outside, calculate in the outside a delay amount per unit bit from the read code, and again set in a register a code shifted by a desired phase difference based upon the calculation result. Although the DLL is a circuit in which stable timings are generated even with variations in condition on a chip, there has been a problem in that a value of a register cannot be changed when register setting is made and hence the DLL cannot follow variations in condition during a test, which may result in a phase amount away from a desired test point.

An object of the present invention is to obtain a semiconductor device that houses a test circuit capable of following a predetermined phase during a test to determine inexpensively whether or not a DDRif normally operates.

A semiconductor device of the present invention is a semiconductor device which transmits or receives a signal to or from an external memory by a DDR system, including a DLL circuit, an arithmetic circuit, first to forth registers, and a transmission circuit.

The DLL circuit determines a phase shift amount.

The arithmetic circuit is connected to the DLL circuit and shifts the phase shift amount by a predetermined phase based upon a test mode signal at test mode time.

The first to fourth registers are connected to the arithmetic circuit and set the phase shift amount shifted by the predetermined phase.

The transmission circuit is connected to the first to fourth registers and a first terminal and a second terminal that transmit or receive a signal to or from the external memory, and shifts a phase based upon the phase shift amount set in the first to fourth registers to transmit or receive a signal.

The transmission circuit has a first phase shifter, a first bidirectional buffer, a second phase shifter, a third phase shifter, a second bidirectional buffer, a fourth phase shifter, and a FIFO.

The first phase shifter is connected to the first register and phase-shifts a first signal to be outputted to the first terminal based upon the phase shift amount set in the first register.

The first bidirectional buffer is connected to the first phase shifter and the first terminal, and outputs or inputs the first signal or a second signal to or from the external memory, or loops back the first signal at the test mode time.

The second phase shifter is connected to the first bidirectional buffer and phase-shifts the first signal or the second signal based upon the phase shift amount set in the second register.

The third phase shifter is connected to the third register and phase-shifts a third signal to be outputted to the second terminal based upon the phase shift amount set in the third register.

The second bidirectional buffer is connected to the third phase shifter and the second terminal, and outputs or inputs the third signal or a fourth signal to or from the external memory, or loops back the third signal at the test mode time.

The fourth phase shifter is connected to the second bidirectional buffer and the fourth register, and phase-shifts the third signal or the fourth signal based upon the phase shift amount set in the fourth register.

The FIFO is connected to the second and fourth phase shifters, and takes out the first or second signal correspondingly to the third or fourth signal.

According to the present invention, an arithmetic circuit is provided at the latter step of a DLL to set registration such that a phase shift amount sequentially changes from the pass side to the fail side so that setup/hold time can be measured without the use of an external tester capable of high-speed operation with high accuracy. Further, a test circuit is housed, thereby to allow reduction in test cost.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 8 and 9 are views each showing the relation of a preamble output in Embodiment 2 of the present invention;

FIG. 10 is a view showing the relation of test signals in Embodiment 2 of the present invention; and FIG. 11 is a view showing an output of a phase shifter 5 in Embodiment 2 of the present invention.

DESCRIPTION OF THE PREFERRED EMBODIMENTS

Embodiment 1

Figure 1:
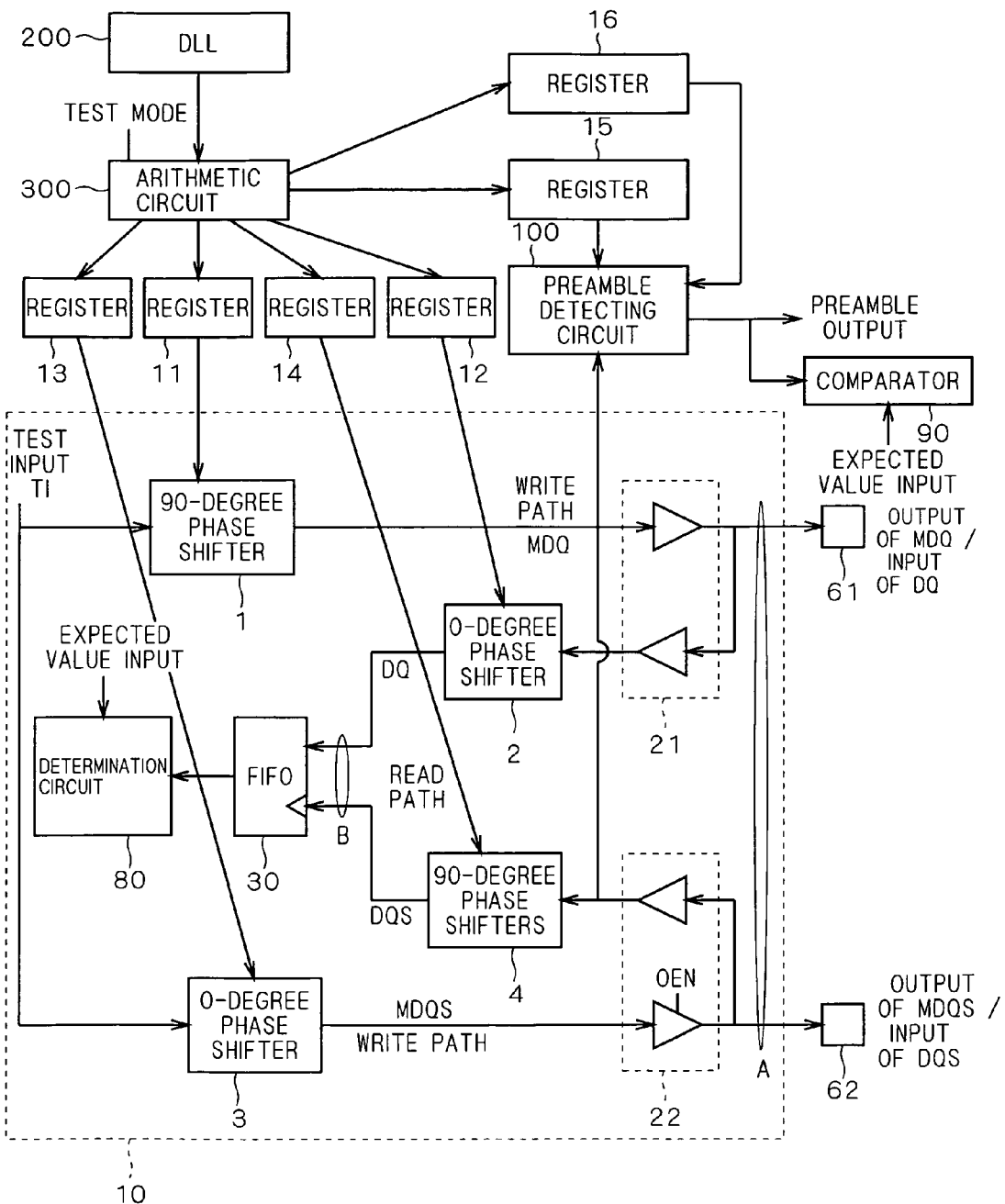
FIG. 1 is a view showing a semiconductor device of the present invention.
Figure 2:
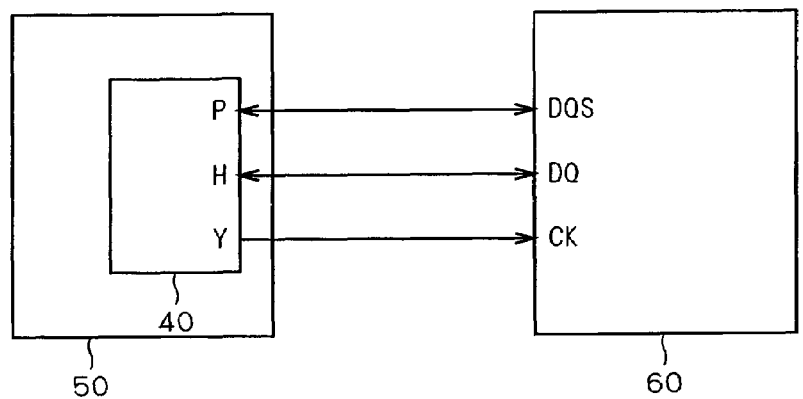
FIG. 2 is a view showing the relation between the semiconductor device of the present invention and a memory.

FIG. 1 is a view showing a configuration of a DDRif (included in a memory controller 40 of FIG. 2) in a semiconductor device 50 of the present invention which transmits or receives a signal to or from an external memory 60 in FIG. 2 by of a DDR system, comprising: a DLL 200 (delay locked loop circuit) which determines a 360-degree phase shift amount; an arithmetic circuit 300 which freely shifts the phase shift amount by a predetermined phase at 0/90/180/270 degrees at normal operation time and based upon a test mode signal at test mode time; registers 11 to 16 (first to sixth registers), which set the phase shift amount shifted by the predetermined phase; a transmission circuit 10 which is connected to the registers 11 to 14 and terminals 61, 62 (first and second terminals) that transmit or receive a signal to or from the external memory 60, and shifts a phase based upon the phase shift amount set in the registers 11 to 14 to transmit or receive a signal; and a preamble detecting circuit 100 which is connected to the registers 15, 16 and detects a preamble period at read time.

The transmission circuit 10 is made up of: a phase shifter 1 (first phase shifter) which phase-shifts an MDQ (data signal, first signal) to be outputted to a terminal 61 based upon the phase shift amount set in the register 11; a bidirectional buffer 21 (first bidirectional buffer) which outputs or inputs the MDQ or a DQ (second signal) to or from the external memory 60, or loops back the MDQ at the test mode time; a phase shifter 2 (second phase shifter) which phase-shifts the MDQ or the DQ based upon the phase shift amount set in the register 12; a phase shifter 3 (third phase shifter) which phase-shifts an MDQS (data strobe signal, third signal) to be outputted to the terminal 62 based upon the phase shift amount set in the register 13; a bidirectional buffer 22 (second bidirectional buffer) which outputs or inputs the MDQS or a DQS (fourth signal) to or from the external memory 60, or loops back the MDQS at the test mode time; a phase shifter 4 (fourth phase shifter) which phase-shifts the MDQS or the DQS based upon the phase shift amount set in the register 14; and a FIFO 30 which takes out the MDQ or the DQ correspondingly to the MDQS or the DQS.

FIG. 2 is a view showing a configuration in which data is transmitted or received between the semiconductor device 50 including the memory controller 40 and the external memory 60. The semiconductor device 50 transmits or receives the MDQS or the DQS to or from a DQS terminal of the external memory 60 via a P terminal of the memory controller 40. Similarly, the semiconductor device 50 transmits or receives the MDQ or the DQ to or from a DQ terminal of the external memory 60 via an H terminal. Moreover, the semiconductor device 50 transmits a clock to a CK terminal of the external memory 60 via a Y terminal.

First, an operation in reading data (read mode) at normal operation time is described with reference to FIGS. 1 and 2. For example, upon receipt of instruction of a read mode from the memory controller 40, the external memory 60 constituted of a DDR-SDRAM transmits read data DQ to the memory controller 40 along with a data strobe signal DQS in synchronism with a clock signal. This DQS is a bidirectional strobe signal for notifying the timing for transfer of read data. The DQS is a ternary signal, and made up of a preamble, a toggle and a postamble. The DQS is set in a high impedance state (HiZ) at data non-transfer time, and set on an L-level about one clock cycle before data transfer at data transfer time. A period in which the DQS is set on the L-level is a preamble period. Subsequently to the preamble period, the DQS is toggled in synchronism with read data, and set in a high impedance state when final data is transferred. An L-level period of the cycle in which final data is transferred is a postamble period. When the preamble period is detected in the preamble detecting circuit 100, an enable signal (EN) of the FIFO 30 is set on an H level of a burst long-term activated state. The FIFO 30 can be synchronized to a clock signal so as to take in burst long data transmitted from the external memory 60.

When the data transmitted from the external memory 60 is taken in in the FIFO 30 as described above, the given DQS is shifted to the central position of a window for read data, and the read data is taken in in accordance with the DQS signal. Therefore, among signals applied from the external memory 60, the DQS is phase-shifted at 90 degrees in the phase shifter 4 via the bidirectional buffer 22 in which an input circuit has been activated. Further, among the signals applied from the external memory 60, the phase of the DQ is changed in the phase shifter 3 such that the phase shift becomes 0 degree via the bidirectional buffer 22 in which an input circuit has been activated, and the data transmitted from the external memory 60 is taken in in the FIFO 30. Here, the phase shift amounts of the phase shifters 2 and 4 are determined by the DLL 200, and the determined phase amounts are set in the registers 12 and 14 to adjust the phase shift amount.

Next, an operation at data write time (write mode) at normal time is described with reference to FIG. 1. When data is written into the external memory 60, the memory controller 40 needs to previously phase-shift the MDQS at 90 degrees so as to output the MDQS aligned at the center of the MDQ. Here, the MDQ is write data, and the MDQS is a bidirectional strobe signal for notifying the timing for transmission of write data. Among applied write signals, the MDQ is phase-shifted at 90 degrees in the phase shifter 1, and the phase of the MDQS is changed in the phase shifter 3 such that the phase shift becomes 0 degree, aligning the MDQS to the center of the MDQ. Further, the MDQS is a ternary signal as is the DQS. The MDQ and the MDQS, having been phase-shifted, are respectively outputted to the external memory 60 via the bidirectional buffers 21 and 22 in which an output circuit has been activated. Here, the phase shift amounts of the phase shifts 1 and 3 are determined by the DLL 200, and the determined phase amounts are set in the registers 11 and 13 to adjust the phase amount.

Figure 3:
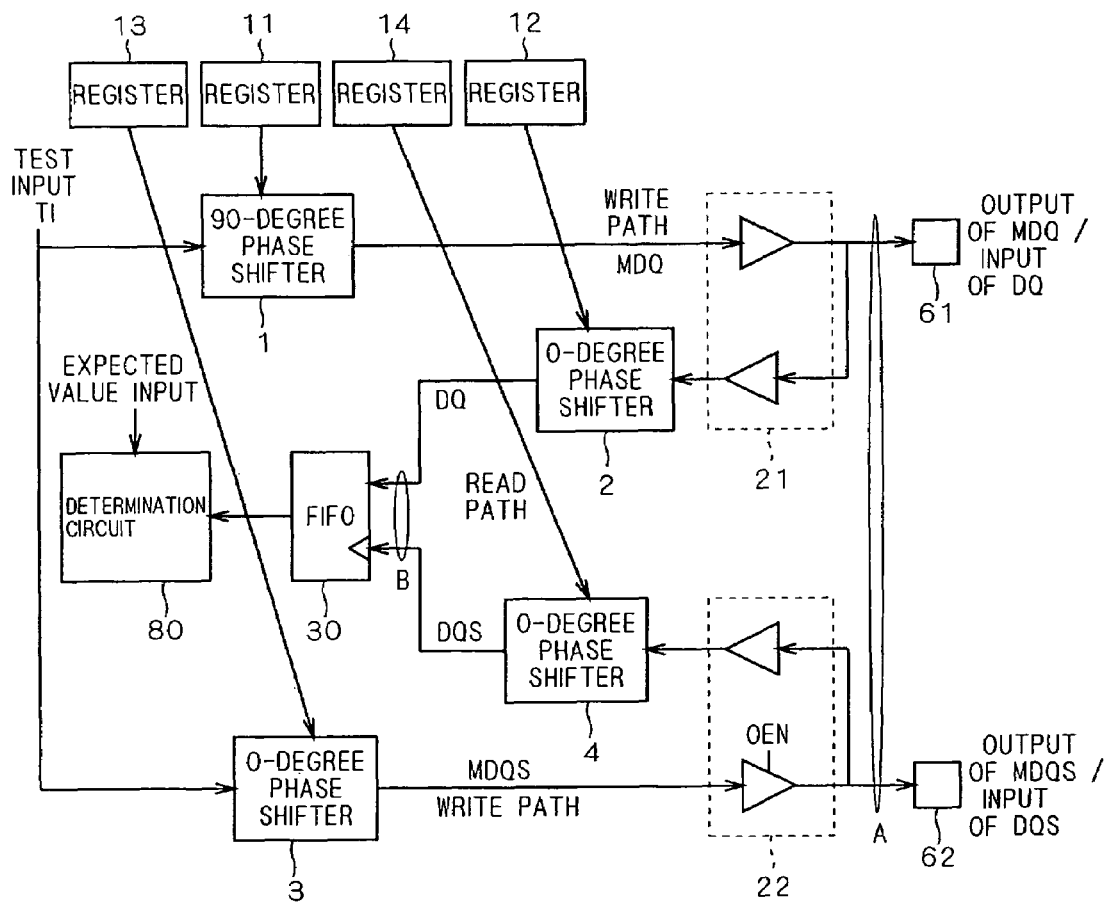
FIGS. 3 and 5 are views each showing a test circuit in a write mode in Embodiment 1 of the present invention.
Figure 4:
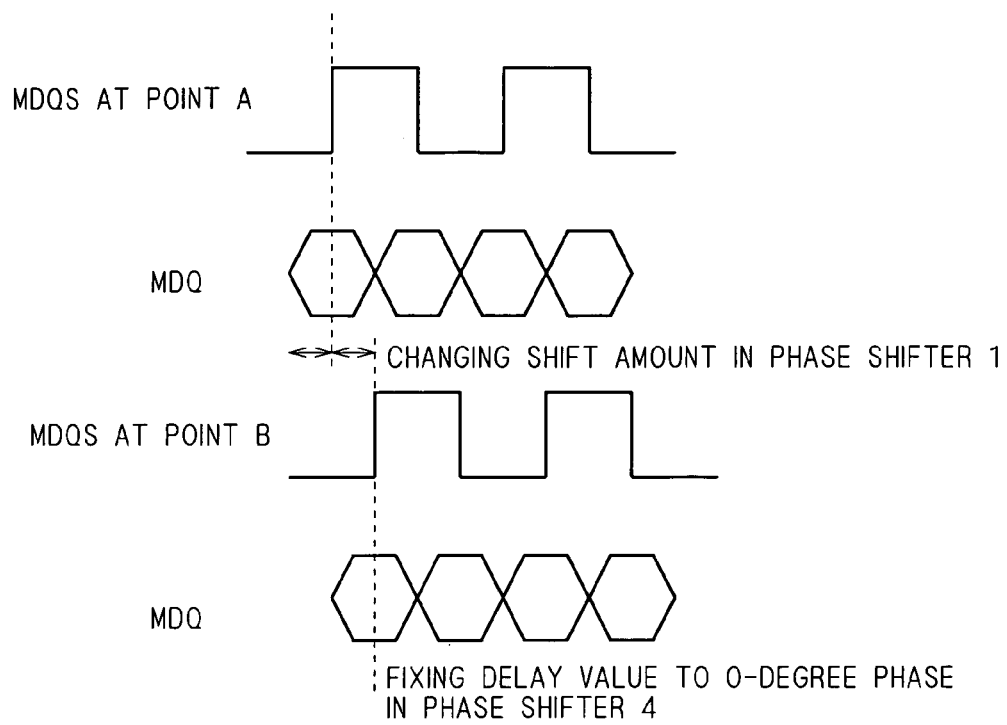
FIGS. 4 and 6 are views each showing the relation of test signals in the write mode in Embodiment 1 of the present invention.

FIG. 3 is a view showing the DDRif housing a test circuit that measures setup/hold time in Embodiment 1 of the present invention, and FIG. 4 is a view showing the relation between MDQS and MDQ as test signals at a point A and a point B in FIG. 3.

An operation in measurement of setup/hold time for a write path at write mode time is described with reference to FIGS. 3 and 4. Here, the setup time is time in which input data needs to be decided prior to the timing for taking-in, and the hold time is time in which the input data needs to be maintained after the timing for taking-in.

First, the memory controller 40 is set in a write test mode, and the bidirectional buffers 21 and 22 are set in a loop-back test mode, to simultaneously activate an input/output circuit. Among test signals applied from a test input T1, the MDQ is phase-shifted at 90 degrees in the phase shifter 1, and transmitted to the output circuit of the bidirectional buffer 21. Similarly, among the test signals applied from the test input T1, the MDQS is phase-shifted at 0 degree in the phase shifter 3, and transmitted to the output circuit of the bidirectional buffer 22. A signal waveform view showing the relation between the MDQ and the MDQS at this time is the view at the point A in FIG. 4, being in a state where the phase has been shifted at 90 degrees. That is, the relation between the MDQ and the MDQS in the write path at the point A at the test time is the same as at the normal operation time.

Next, the MDQ transmitted to the output circuit of the bidirectional buffer 21 loops back and passes through the input circuit of the bidirectional buffer 21, and is phase-shifted at 0 degree in the phase shifter 2, to be inputted into the FIFO 30. Similarly, the MDQS transmitted to the output circuit of the bidirectional buffer 22 loops back and passes through the input circuit of the bidirectional buffer 22, and is phase-shifted at 0 degree in the phase shifter 4, to be inputted into the FIFO 30. Here, setting is made in the register 14 such that the phase shifter 4 phase-shifts the DQS at 90 degrees at the normal operation time, but changes the phase to 0 degree at the write test mode. This results in application of the MDQS and the MDQ inputted into the FIFO 30 while holding the phase difference of 90 degrees. A signal waveform view showing the relation between the MDQ and the MDQS at this time is the view at the point B in FIG. 4.

In the write test mode, the arithmetic circuit 300 sequentially sets in the register 11 a set value for shifting, by a predetermined phase, a 90-degree phase shift amount of the phase shifter 1 determined in the DLL 200 in accordance with the test mode signal. Since this leads to a change in phase difference between the MDQS and the MDQ to be inputted into the FIFO 30, pass/fail determination is performed by comparison of an output of the FIFO 30 with an expected value by the determination circuit 80, and reading a register value at that time then allows measurement of the setup/hold time for the write path.

Figure 5:
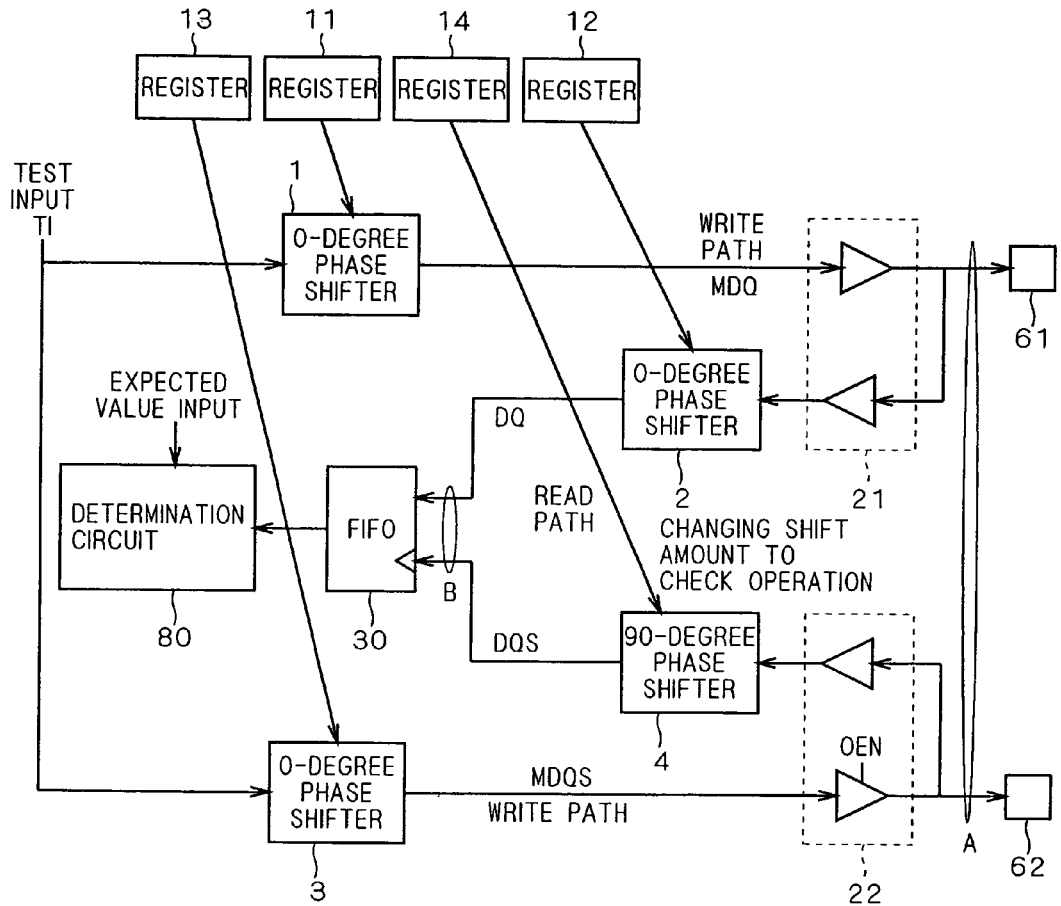
Figure 6:
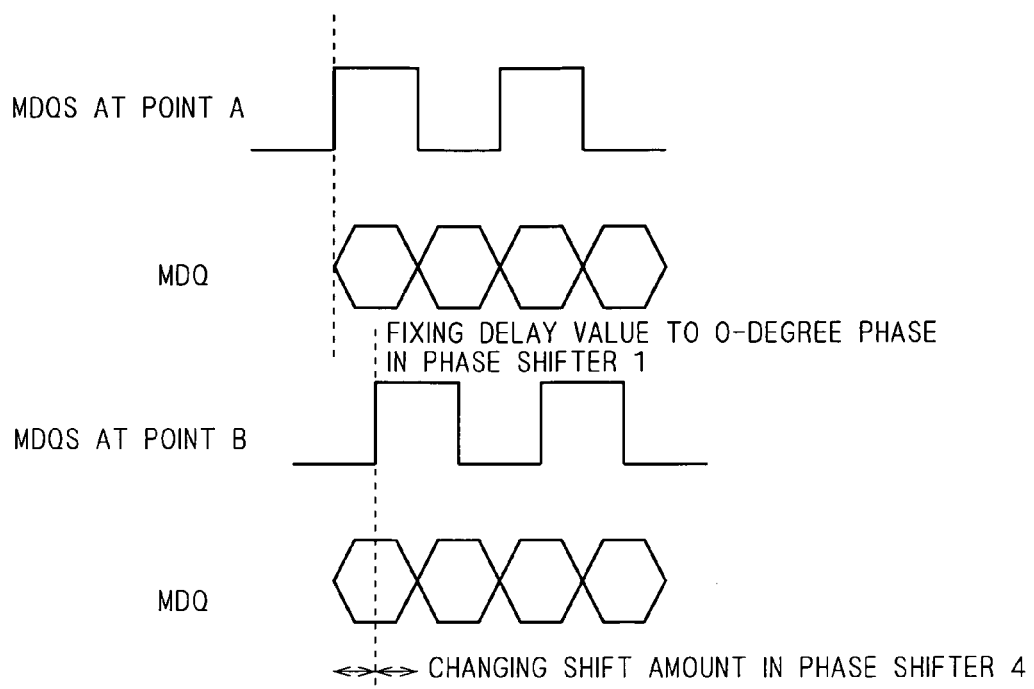

Next, an operation to measure setup/hold time for a read path at read mode time is described with reference to FIGS. 5 and 6. First, the memory controller 40 is set in a read test mode, and the bidirectional buffers 21 and 22 are set in a loop-back test mode, to simultaneously activate the input/output circuits. Among test signals applied from the test input T1, the MDQ is phase-shifted at 0 degree in the phase shifter 1, and transmitted to the output circuit of the bidirectional buffer 21. Similarly, among the test signals applied from the test input T1, the MDQS is phase-shifted at 0 degree in the phase shifter 3, and transmitted to the output circuit of the bidirectional buffer 22. A signal waveform view showing the relation between the MDQ and the MDQS at this time is a view at the point A in FIG. 5, where the phase of the MDQ is the same as that of the MDQS. Here, setting is made in the register 11 such that the phase shifter 1 phase-shifts the MDQ at 90 degrees at the normal operation time, but changes the phase to 0 degree at the read test mode.

Next, the MDQ transmitted to the output circuit of the bidirectional buffer 21 loops back and passes through the input circuit of the bidirectional buffer 21, and is phase-shifted at 0 degree in the phase shifter 2, to be inputted into the FIFO 30. Similarly, the MDQS transmitted to the output circuit of the bidirectional buffer 22 loops back and passes through the input circuit of the bidirectional buffer 22, and is phase-shifted at 90 degrees in the phase shifter 4, to be inputted into the FIFO 30. This results in application of the MDQS and the MDQ inputted into the FIFO 30 with the phase in the state of being shifted at 90 degrees. A signal waveform view showing the relation between the MDQ and the MDQS at this time is a view at the point B in FIG. 6.

In the read test mode, the arithmetic circuit 300 sequentially sets in the register 14 a set value for shifting, by a predetermined phase, a 90-degree phase shift amount of the phase shifter 4 determined in the DLL 200 in accordance with the test mode signal. Since this leads to a change in phase difference between the MDQS and the MDQ to be inputted into the FIFO 30, pass/fail determination is performed by comparison of an output of the FIFO 30 with an expected value by the determination circuit 80, and reading a register value at that time then allows measurement of the setup/hold time for the read path.

Embodiment 2

Figure 7:
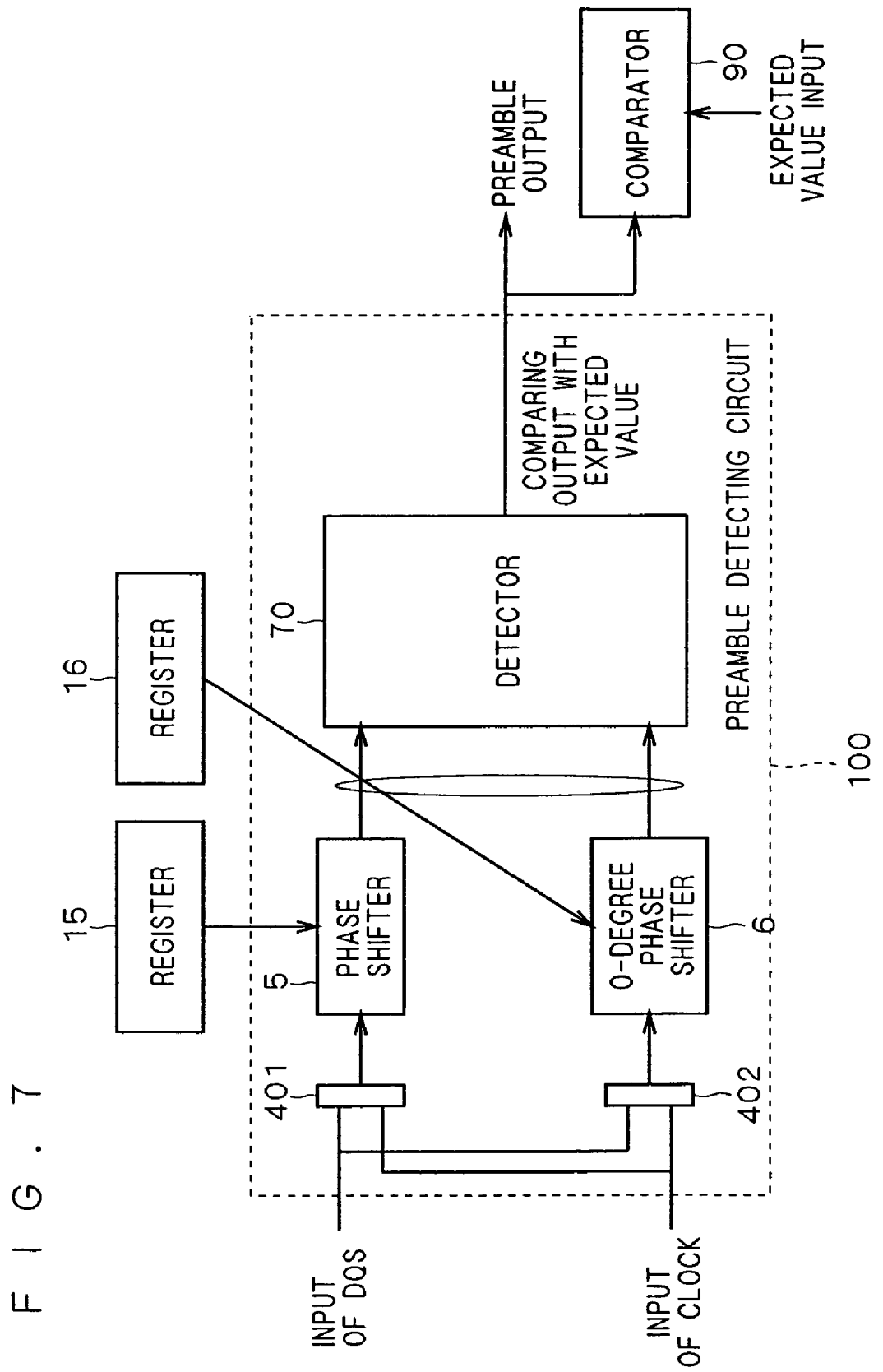
FIG. 7 is a view showing a test circuit in Embodiment 2 of the present invention.

FIG. 7 is a view showing a DDRif housing a test circuit that measures Duty, the preamble period and the postamble period in Embodiment 2 of the present invention. A preamble detecting circuit 100, which detects the preamble period of the DQS by comparing a DQS phase-shifted based upon the phase shift amount set in the register 16 with a DQS phase-shifted based upon the phase shift amount set in the register 15; and a comparator 90, which compares an output of the preamble detecting circuit 100 with an expected value are included.

An operation to detect the preamble period performed by the preamble detecting circuit 100 at the normal operation time is described. The preamble is an operation of L-outputting from one cycle before a rising edge of the DQS outputted by the DDR-SDRAM in synchronism with correct data. In the specification for the read mode time, the L-period of the DQS is set to 0.9 to 1.1 cycles. It is to be noted that there is no particular specification for a state before the 1.1 cycles. The DLL 200 sets a delay code of the register 15 to 0.9 tCK at the normal operation time, and the preamble detecting circuit 100 compares the DQS with delayed DQS obtained by delaying the DQS by 0.9 tCK, to detect a preamble period. When the preamble period satisfies the specification, the FIFO 30 starts taking in data transmitted from the DDR-SDRAM. Here, the arithmetic circuit 300 does not add a predetermined delay amount at the normal operation time.

FIG. 7 is a circuit to detect the preamble as described above. The register 15 adds the delay amount of 0.9 tCK to the phase shifter 5, and the DQS transferred from the external memory 60 is delayed by 0.9 tCK in the phase shifter 5. The delay amount of the DQS that passes through the phase shifter 6 is 0, and respective signals outputted from the phase shifters 5 and 6 are inputted into the detector 70. FIGS. 8 and 9 are views showing the relation among the DQS, the delayed DQS and the preamble output. The detector 70 compares the DQS with the delayed DQS to detect the preamble period, and outputs a detection signal showing a detection result as the preamble output.

The operation in comparing the DQS with the delayed DQS added with the delay amount of 0.9 tCK is described further in detail with reference to FIGS. 7 to 9. As shown in FIG. 8, in the case of the preamble period of the DQS being not less than 0.9 cycles that satisfies the specification, when the DQS rises to the H-level after the lapse of the preamble period, the delayed DQS is on the L-level, and the preamble output changes from H to L. With this change, the FIFO 30 is reset. Subsequently, when the DQS rises to the H-level, the delayed DQS is on the H-level, and the preamble output changes from L to H. With this change, the FIFO 30 starts taking in data transmitted from the DDR-SDRAM. Meanwhile, when the DQS is temporarily added with noise and becomes H, and subsequently becomes L, the FIFO 30 is reset, but the preamble output does not become H unless the DQS becomes H within predetermined time, and the FIFO 30 does not take in data transmitted from the DDR-SDRAM. Moreover, as shown in FIG. 9, in the case of the preamble period being shorter than the specified value, since the delayed DQS has not become L when the DQS rises to the H-level, the FIFO 30 is not reset and does not take in data transmitted from the DDR-SDRAM.

Next, an operation at the test mode time is described with reference to FIGS. 1 and 7. The memory controller 40 is set in the test mode, and the bidirectional buffer 22 is set in the loop-back test, to simultaneously activate the input/output circuits. A test signal applied from the test input T1 is looped back in the bidirectional buffer 22, to be inputted into the preamble detecting circuit 100. At the time of measuring Duty of the DQS, a predetermined delay amount (e.g. delay amount of 0.45 to 0.55 tCK) is added to the delay amount determined in the DLL 200 in the arithmetic circuit 300, which is then set in the register 15. The register 15 transmits the delay mount of 0.45 to 0.55 tCK to the phase shifter 5. The DQS as the test signal applied from the test input T1 is added with the delay amount in the phase shifter 5, and then inputted into the detector 70. Meanwhile, the DQS as the test signal applied from the test input T1 passes through the phase shifter 6 with the delay amount of 0.

FIG. 10 is a view showing the relation among the DQS, the 0.55 tCK-delayed DQS, and the 0.45 tCK-delayed DQS. In the case of Duty of DQS being from 45 to 55%, when the DQS rises to H, the 0.55 tCK-delayed DQS becomes H, and 0.45 tCK-delayed DQS becomes L. While the delay amount of the DQS is sequentially changed, the signal outputted from the detector 70 is compared with an expected value in the comparator 90, thereby allowing measurement of Duty of the DQS.

Next, operations in measuring the preamble period and the postamble period are described. The memory controller 40 is set in the test mode, and the bidirectional buffer 22 is set in the loop-back test mode, to simultaneously activate the input/output circuits. A test signal applied from the test input T1 is looped back in the bidirectional buffer 22 and inputted into the preamble detecting circuit 100. This test mode is a write mode, and the DQS is made up of a write preamble, a toggle, and a write postamble. The preamble period and the postamble period at the write mode are about 0.5 cycles, respectively.

FIG. 11 is a view showing an output of the phase shifter 5. In the same method as the above-mentioned measurement of Duty of the DQS, while the delay amount is sequentially changed, H/L change periods of the preamble period and the postamble period are detected, thereby allowing measurement of the preamble period and the postamble period.

Here, the DQS output in normal use is set at HiZ (high impedance) by changing an OEN signal of FIG. 1 to H before the preamble period and after the postamble period, but at the test mode time, H data is outputted from the test input T1 also in this period. It is thereby possible to reliably prevent malfunction of the detector 70 in determination.

It is also possible to measure Duty of a clock by switching selectors 401 and 402 and to measure the phase difference between the DQS and a clock in the similar method.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device which transmits or receives a signal to or from an external memory by a DDR system, comprising:
   a DLL circuit, which determines a phase shift amount;
   an arithmetic circuit, which is connected to said DLL circuit and shifts said phase shift amount by a predetermined phase based upon a test mode signal at test mode time;
   first to fourth registers, which are connected to said arithmetic circuit and set said phase shift amount shifted by said predetermined phase; and
   a transmission circuit, which is connected to said first to fourth registers and a first terminal and a second terminal that transmit or receive a signal to or from said external memory, and shifts a phase based upon said phase shift amount set in said first to fourth registers to transmit or receive a signal,
   wherein said transmission circuit includes:
   a first phase shifter, which is connected to said first register and phase-shifts a first signal to be outputted to said first terminal based upon said phase shift amount set in said first register;
   a first bidirectional buffer, which is connected to said first phase shifter and said first terminal, and outputs or inputs said first signal or a second signal to or from said external memory, or loops back said first signal at said test mode time;
   a second phase shifter, which is connected to said first bidirectional buffer and phase-shifts said first signal or said second signal based upon said phase shift amount set in said second register;
   a third phase shifter, which is connected to said third register and phase-shifts a third signal to be outputted to said second terminal based upon said phase shift amount set in said third register;
   a second bidirectional buffer, which is connected to said third phase shifter and said second terminal, and outputs or inputs said third signal or a fourth signal to or from said external memory, or loops back said third signal at said test mode time;
   a fourth phase shifter, which is connected to said second bidirectional buffer and said fourth register, and phase-shifts said third signal or said fourth signal based upon said phase shift amount set in said fourth register; and
   a FIFO, which is connected to said second and fourth phase shifters, and takes out said first or second signal correspondingly to said third or fourth signal.

2. The semiconductor device according to claim 1, further comprising a determination circuit which compares an output of said FIFO with an expected value.

3. The semiconductor device according to claim 2, wherein said arithmetic circuit shifts said determined phase shift amount by a predetermined phase in accordance with a test mode signal at the test mode time.

4. A semiconductor device, which transmits or receives a signal to or from an external memory by a DDR system, comprising:
- a DLL circuit, which determines a phase shift amount;
- an arithmetic circuit, which is connected to said DLL circuit and shifts said determined phase shift amount by a predetermined phase;
- a fifth register, which is connected to said arithmetic circuit and sets said phase shift amount shifted by said predetermined phase;
- a preamble detecting circuit, which is connected to said fifth register and compares an input signal with a signal obtained by phase-shifting said input signal based upon the phase shift amount set in said fifth register to detect a preamble period of said input signal; and
- a comparator, which compares an output of said preamble detecting circuit with an expected value.

5. The semiconductor device according to claim 4, further comprising a sixth register, which is connected to said arithmetic circuit and said preamble detecting circuit, and sets said phase shift amount shifted by said predetermined phase,
- wherein said preamble detecting circuit compares an input signal phase-shifted based upon the phase shift amount set in said sixth register with a signal obtained by phase-shifting said input signal based upon the phase shift amount set in said fifth register, to detect a preamble period of said input signal.

6. The semiconductor device according to claim 4, wherein said arithmetic circuit shifts a phase shift amount by a predetermined phase based upon a test mode signal at the test mode time.

\* \* \* \* \*